(12) United States Patent
Lorenzen et al.

(10) Patent No.: US 7,801,190 B2
(45) Date of Patent: Sep. 21, 2010

(54) CARRIER FOR A VERTICAL ARRANGEMENT OF LASER DIODES WITH A STOP

(75) Inventors: Dirk Lorenzen, Jena (DE); Petra Hennig, Moersdorf (DE); Matthias Schroeder, Stadtroda (DE); Ulrich Roellig, Jena (DE)

(73) Assignee: JENOPTIK Laser GmbH, Jena (DE)

( * ) Notice: Subject to any disclaimer, the term of this patent is extended or adjusted under 35 U.S.C. 154(b) by 18 days.

(21) Appl. No.: 12/223,001

(22) PCT Filed: Jan. 16, 2007

(86) PCT No.: PCT/DE2007/000069

§ 371 (c)(1),
(2), (4) Date: Jul. 17, 2008

(87) PCT Pub. No.: WO2007/082508

PCT Pub. Date: Jul. 26, 2007

(65) Prior Publication Data

US 2009/0016398 A1    Jan. 15, 2009

(30) Foreign Application Priority Data

Jan. 18, 2006 (DE) ........................ 10 2006 002 876

(51) Int. Cl.
*H01S 3/00* (2006.01)
(52) U.S. Cl. .............................. 372/36; 372/34; 372/35; 372/50.12
(58) Field of Classification Search .............. 372/34–36
See application file for complete search history.

(56) References Cited

U.S. PATENT DOCUMENTS 5,325,384 A    6/1994 Herb et al.

(Continued)

FOREIGN PATENT DOCUMENTS

DE    102 29 712    7/2002
DE    103 61 899    12/2003

OTHER PUBLICATIONS

XP 000272686 / IEEE Journal of Quantum Electronics, vol. 28, No. 4, Apr. 1992, pp. 952-965, Endriz, et al. High Power Diode Laser Arrays.

(Continued)

*Primary Examiner*—Tod T Van Roy
(74) *Attorney, Agent, or Firm*—Frommer Lawrence & Haug LLP

(57) ABSTRACT

A laser radiation source which is scalable with respect to output is designed in such a way that laser diode elements can be arranged on a carrier so as to be stacked equidistantly and with low stress at a low manufacturing cost. The laser radiation source comprises a vertical stack of laser diode elements contacted on both sides via electrically conductive substrate layers, and at least one multi-layer carrier comprising a first and a second metallic layer which are separated by at least one electrically insulating layer of nonmetallic material. At least one of the metallic layers is divided into metallic layer regions which are arranged adjacent to one another and at a distance from one another. Oppositely polarized substrate layers of adjacent laser diode elements are arranged on common layer regions of a metallic layer. Collimating lenses serve to collimate the radiation emitted by the laser diode elements.

22 Claims, 6 Drawing Sheets

U.S. PATENT DOCUMENTS

| | | | | |
|---|---|---|---|---|
| 5,835,515 | A | * | 11/1998 | Huang .................. 372/36 |
| 5,923,692 | A | | 7/1999 | Staskus et al. |
| 5,985,684 | A | * | 11/1999 | Marshall et al. ............. 438/26 |
| 5,999,269 | A | | 12/1999 | Haugsjaa et al. |
| 6,352,873 | B1 | * | 3/2002 | Hoden .................. 438/28 |
| 6,424,667 | B1 | | 7/2002 | Endriz et al. |
| 6,621,839 | B1 | * | 9/2003 | Schroeder et al. ............ 372/36 |
| 2004/0082112 | A1 | * | 4/2004 | Stephens .................. 438/122 |
| 2004/0233946 | A1 | * | 11/2004 | Moto .................. 372/36 |

OTHER PUBLICATIONS

XP 010283870 / Electronic Components and Technology Conference, May 1998, pp. 1395-1401, Weiss, et al., "Design, Simulation and Technology Realization of a Reliable Packaging Concept for High Power Laser Bars".

XP 009081286 / Proceedings of the SPIE, vol. 4945, Oct. 2002, pp. 174-185, Lorenzen, et al., "Highly Thermally Conductive Substrates with Adjustable CTE for Diode Laser Bar Packaging".

\* cited by examiner

CARRIER FOR A VERTICAL ARRANGEMENT OF LASER DIODES WITH A STOP

The present application claims priority from PCT Patent Application No. PCT/DE2007/000069 filed on Jan. 16, 2007, which claims priority from German Patent Application No. DE 10 2006 002 876.7 filed on Jan. 18, 2006, the disclosure of which is incorporated herein by reference in its entirety.

BACKGROUND OF THE INVENTION

1. Field of the Invention

The invention is directed to a laser radiation source having a vertical stack of laser diode elements.

2. Description of Related Art

In industrial laser material processing as well as in medical engineering, high-power diode lasers in the form of laser diode bars which can be stacked to form two-dimensionally emitting surfaces with an elevated radiation output are generally used for pumping solid state lasers.

Out of the numerous suggestions for stacks, as they are called, U.S. Pat. No. 5,923,692 A describes a high-power diode laser array formed of vertically stacked laser diode bars which are contacted via electrically conducting substrate layers. By means of one of the substrate layers, thermal contact is made with a thermally conductive, electrically insulating carrier plate that is connected to a heatsink. The laser diode bars are connected in series in that the electrically conducting substrate layers of adjacent laser diode bars are directly bonded to one another.

This is disadvantageous on the one hand in that thermo-mechanical stresses can occur because the laser diode bars are interconnected as well as being connected to the carrier plate. On the other hand, variations in thickness in the laser diode bars and electrically conducting substrate layers lead to variations in the spacing between the laser diode bars.

SUMMARY OF THE INVENTION

Therefore, it is the object of the invention to design a laser radiation source with scalable output in such a way that laser diode elements can be arranged on a carrier so as to be stacked equidistantly and with low tension at a low manufacturing cost.

According to the invention, this object is met by a laser radiation source comprising a vertical stack of laser diode elements which are bonded on both sides by substrate layers of electrically conductive material and at least a first multi-layer carrier comprising a first and at least a second metallic layer which are separated by at least one electrically insulating layer of nonmetallic material, wherein at least one of the metallic layers is divided into metallic layer regions which are arranged adjacent to one another and at a distance from one another, and wherein oppositely polarized substrate layers of adjacent laser diode elements are arranged on common layer regions of a metallic layer.

According to the invention, every laser diode element makes electrical contact with the electrically conducting layer regions, and therefore makes thermal contact with the carrier, by the p-side and n-side substrate layers. Because common layer regions are used for oppositely polarized substrate layers of adjacent laser diode elements, the current flows over the layer regions of the carrier in the series connection.

Therefore, it is particularly advantageous when a gap is left between the oppositely polarized substrate layers of adjacent laser diode elements so that the laser diode elements can be positioned equidistant from one another with high accuracy in that thickness tolerances in the laser diode elements and in the substrate layers are compensated in a simple manner.

A low-stress construction can be provided because the sandwich-type components of laser diode elements and substrate layers can be arranged on the carrier individually and independently from one another.

DCB technique is especially suited to the production of the carrier because a construction produced in this way ensures good thermal conductivity on one hand but also permits several hundreds of amperes to be conducted through sufficient layer thicknesses of the surface layers made of copper.

Further advantages consist in that the invention provides a light laser radiation source which has few components and no screw connections or loose mechanical parts and which is free from outgassing materials. In addition, a simple scaling can be realized by means of the suggested concept.

In an advantageous development, the carrier can be outfitted with a micro-cooler which is arranged between nonmetallic layers and which has channels for a coolant, a supply channel and a discharge channel being provided in the bottom of the carrier for this coolant.

The substrate layers which bound the vertical stack of laser diode elements are soldered individually, respectively, to a layer region and an electric contact element is guided to each layer region for supplying current. This is advantageous when the layer regions on which the substrate layers bounding the vertical stack of laser diode elements are soldered make electrical contact with a respective layer region on the side of the carrier opposite to that on which the electric contact elements are arranged at the layer region—for example, by feedthrough in the electrically insulating layer.

Other advantageous constructions and further developments of the laser radiation source according to the invention are indicated in the dependent claims.

DETAILED DESCRIPTION OF EMBODIMENTS

Figure 1:
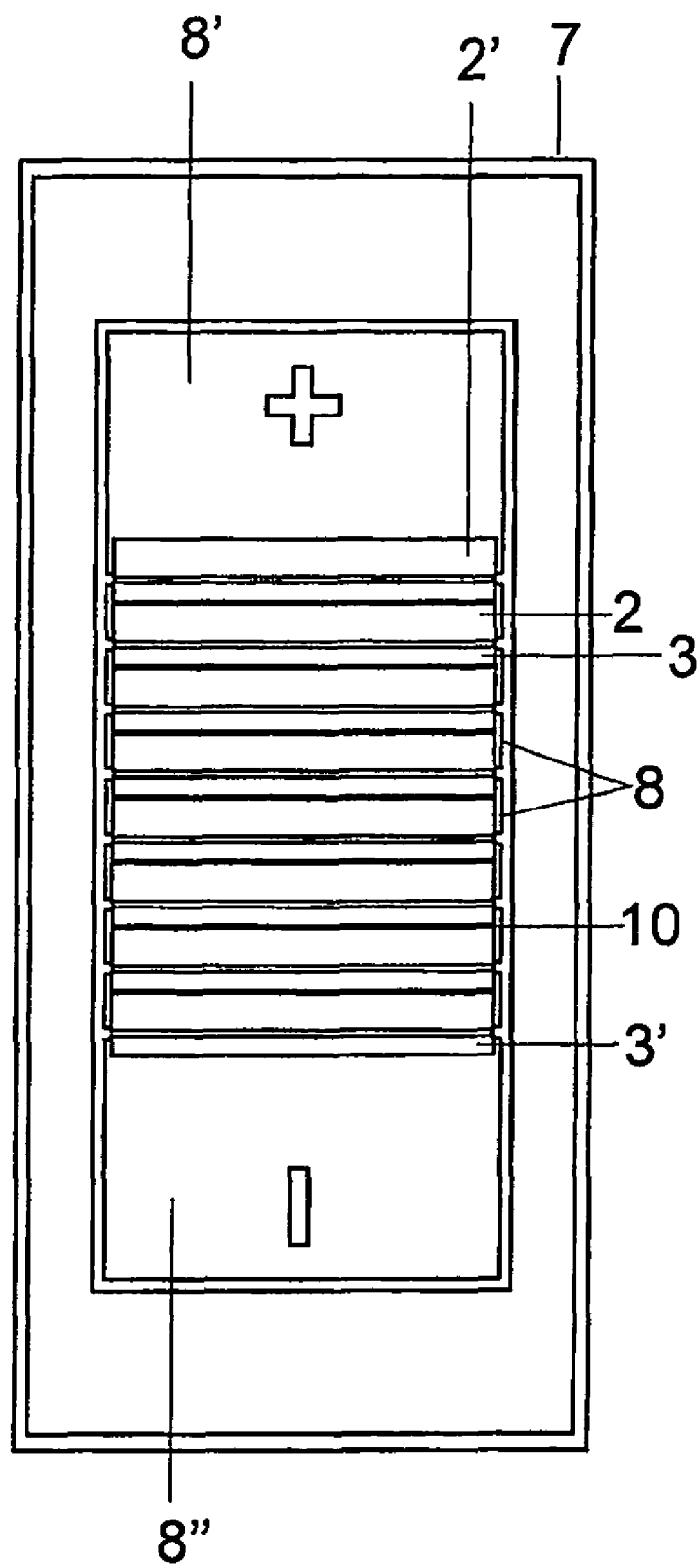
FIG. 1 shows a top view of a laser radiation source according to the invention.

It is to be understood that the figures and descriptions of the present invention have been simplified to illustrate elements that are relevant for a clear understanding of the present invention, while eliminating, for purposes of clarity, many other elements which are conventional in this art. Those of ordinary skill in the art will recognize that other elements are desirable for implementing the present invention. However, because such elements are well known in the art, and because they do not facilitate a better understanding of the present invention, a discussion of such elements is not provided herein.

The present invention will now be described in detail on the basis of exemplary embodiments.

In the laser radiation source shown in FIGS. 1 to 6, laser diode elements (e.g., made from GaAs) which are constructed as laser diode bars 1 bonded to, and therefore contact via, substrate layers 2, 3 of electrically conducting material (e.g., substrate layers with a thermal coefficient of expansion similar to that of the material of the laser diode bar such as copper-tungsten) at the p-side and n-side by means of hard solder (e.g., eutectic gold-tin Au80Sn20) and are arranged on a carrier 4 serving to supply current and dissipate heat.

The thickness of the substrate layers 2, 3, i.e., their dimensioning in the stacking direction of the laser diode bars 1, is comparable to the resonator length of the laser diode bars 1. In preferred embodiments, the thickness of the p-side substrate layers 2 should be 0.5 to 1 times the resonator length of the laser diode bars 1 and the thickness of the n-side substrate layers 3 should be 0.25 to 0.5 times the resonator length of the laser diode bars 1. A change in spacing (pitch) between the laser diode bars 1 can be carried out by altering the thicknesses of the n-side substrate layers 3.

The length L of the substrate layers 2, 3 along the layer regions 8 exceeds the resonator length, but is preferably always less than twice the resonator length for reasons relating to the thermal path length.

The carrier 4 which is constructed as a thin plate and is preferably produced by the DCB (Direct Copper Bonding) method has metallic layers 5, 6 of copper on the top and bottom which are separated by at least one nonmetallic layer 7 of an aluminum nitride ceramic.

It is important that the sum of the thicknesses of the metallic layers and the sum of the thicknesses of the nonmetallic layers have a defined ratio to one another in order to achieve a mean thermal expansion coefficient in the mounting plane that approximately corresponds to that of the supported elements.

In the particular case of copper which is applied using the DCB method and which acquires a well-defined hardness through this method, the sum of the thicknesses of the metallic layers should be twice the sum of the thicknesses of the nonmetallic layers made of aluminum nitride. Suitable copper layer thicknesses range from 0.1 mm to 1 mm according to the thickness of the ceramic layer and, through their rigidity, ensure extensive flatness of the carrier 4.

With coppers of other degrees of hardness, a different thickness ratio is required to obtain a desired thermal expansion coefficient for the carrier 4. For a Vickers hardness of the copper in the range of HV60 to HV120, thickness ratios should be selected so that the sum of the thicknesses of the metallic layers to the sum of the thicknesses of the nonmetallic layers has ratios from 1.5:1 to 2.0:1.

On the side of the carrier 4 that is intended to receive the laser diode bars 1, the metallic layer, in this case the layer 5 on top, is divided into layer regions 8 which, as electrical conductors, form strips which are parallel to one another and arranged adjacent to one another at a distance from one another. The substrate layers 2, 3 of electrically conducting material are soldered on the layer regions 8, preferably with a hard solder such as, e.g., eutectic gold-tin Au80Sn20, so that an electrical contact with the layer regions 8 as well as a thermal contact with the carrier 4 are produced over both substrate layers 2, 3.

According to the invention, the substrate layers 2, 3 are connected to the layer regions 8 in such a way that oppositely polarized substrate layers 2, 3 of adjacent laser diode bars 1 are arranged on common layer regions 8.

It is particularly advantageous for an equidistant spacing between the laser diode bars 1 to leave a gap 10 between the oppositely polarized substrate layers 2, 3 because the current is guided from the n-contact of a first laser diode bar 1 to the p-contact of an adjacent second laser diode bar 1, according to the invention, via the carrier 4, particularly over a common layer region 8.

The two outside substrate layers of the laser diode stack, a substrate layer 2' on the p-contact side and a substrate layer 3' on the n-contact side, are each soldered individually to a layer region 8' and 8", respectively, and an electric contact element, not shown, is guided to each layer region 8', 8" for supplying current.

Figure 5:
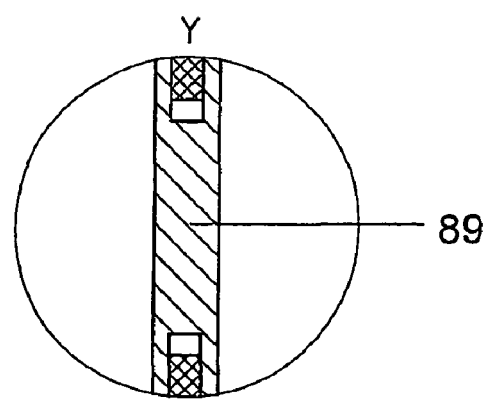
FIG. 5 shows a feedthrough between layer regions on the top and bottom of the carrier in a detail Y from FIG. 3.

The supply of current is preferably carried out by providing electric feedthrough 89, shown in FIG. 5, from the layer regions 8', 8" through the nonmetallic layer 7 to a layer region 9', 9" on the opposite side of the carrier 4. Accordingly, when the electric contact elements are arranged on the opposite side, the side of the carrier 4 with the laser diode bars 1 can be kept free from relatively large electric contact elements that could hinder the beam propagation.

Figure 2:
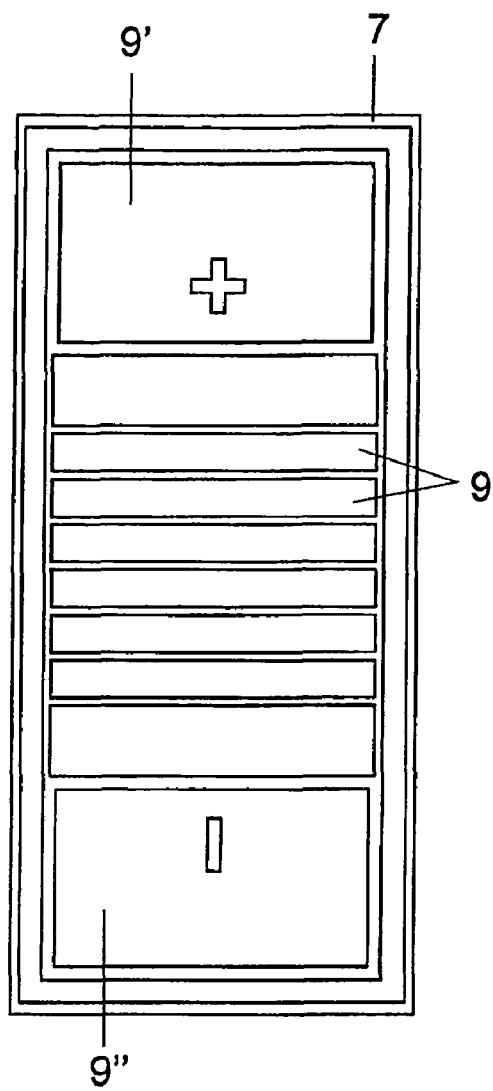
FIG. 2 shows the underside of the carrier for a laser diode stack according to the invention.
Figure 3:
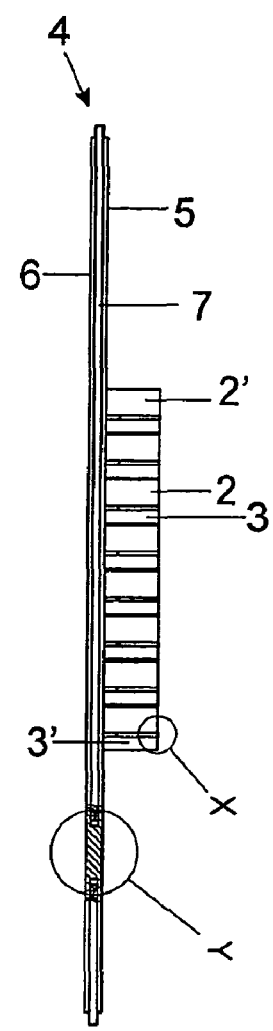
FIG. 3 shows a side view of the laser radiation source according to FIG. 1.
Figure 4:
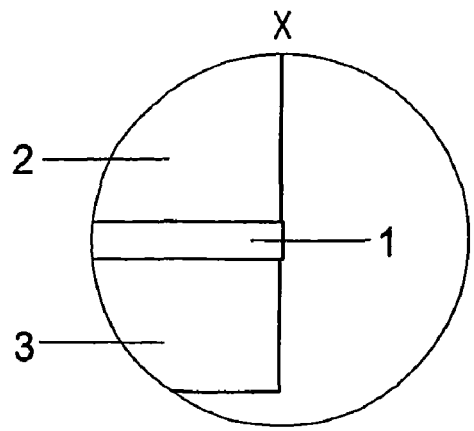
FIG. 4 shows a detail X from FIG. 3.

To prevent possible warping of the carrier 4 during the process of joining the layers 5, 6 and 7 or when mounting the connected elements 1, 2 and 3 on the carrier 4, the metallic layer 6 on the underside of the carrier 4 is also preferably divided into layer regions 9, and layer regions 9 can be arranged opposite to layer regions 8 or so as to be offset relative to them as is shown in FIG. 2.

Figure 6:
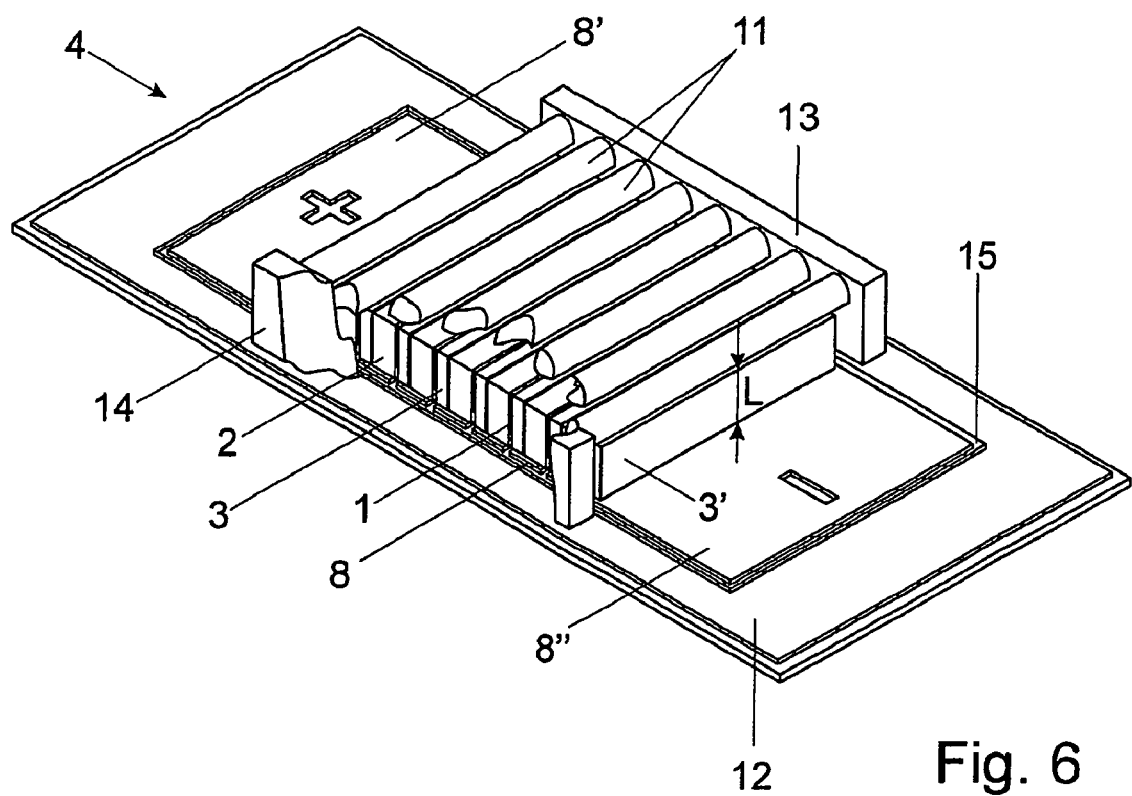
FIG. 6 shows the positioning of collimator lenses in front of each laser diode bar of the laser diode stack.

Depending on the thickness of the n-side substrate layers 3, the necessary installation space can be created so that collimator lenses 11 can be arranged in front of each laser diode bar 1 as is shown in FIG. 6.

Bridge elements 13, 14 which are positioned lateral to the laser diode bars 1 and soldered to the carrier 4 on a layer region 12 of the metallic layer 5 are suitable in a particularly advantageous manner for this purpose, the collimator lenses 11 being fastened thereto, e.g., by laser-initiated solder connections with low-melting solders such as, e.g., eutectic tin-silver-copper (SAC solder) with a high tin content.

The layer region 12 is electrically isolated from the rest of the layer regions 8, 8' and 8" of the top metallic layer by a circumferentially continuous gap 15.

Figure 7:
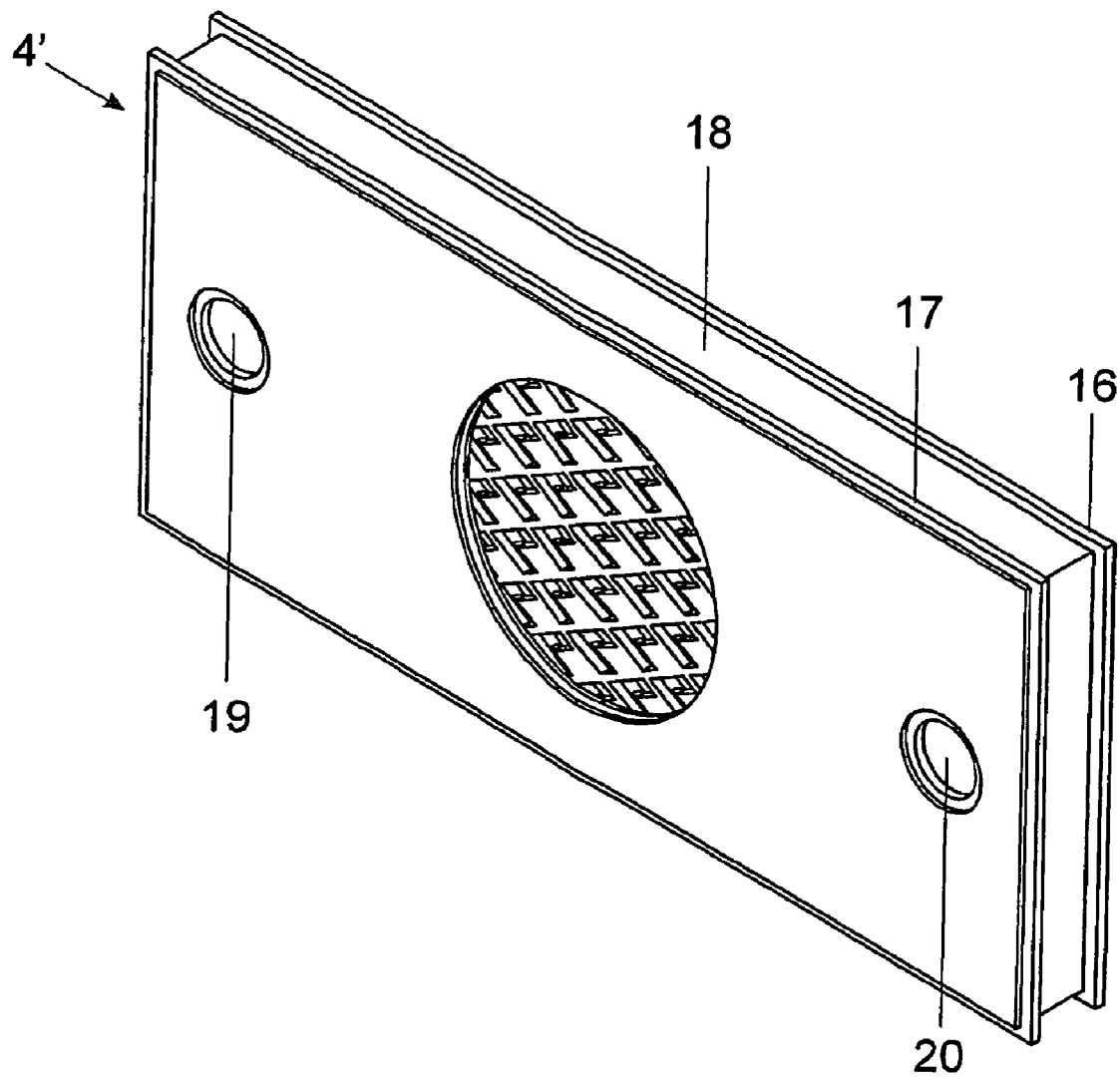
FIG. 7 shows a carrier designed as a micro-cooler for the laser diode stack.
Figure 8:
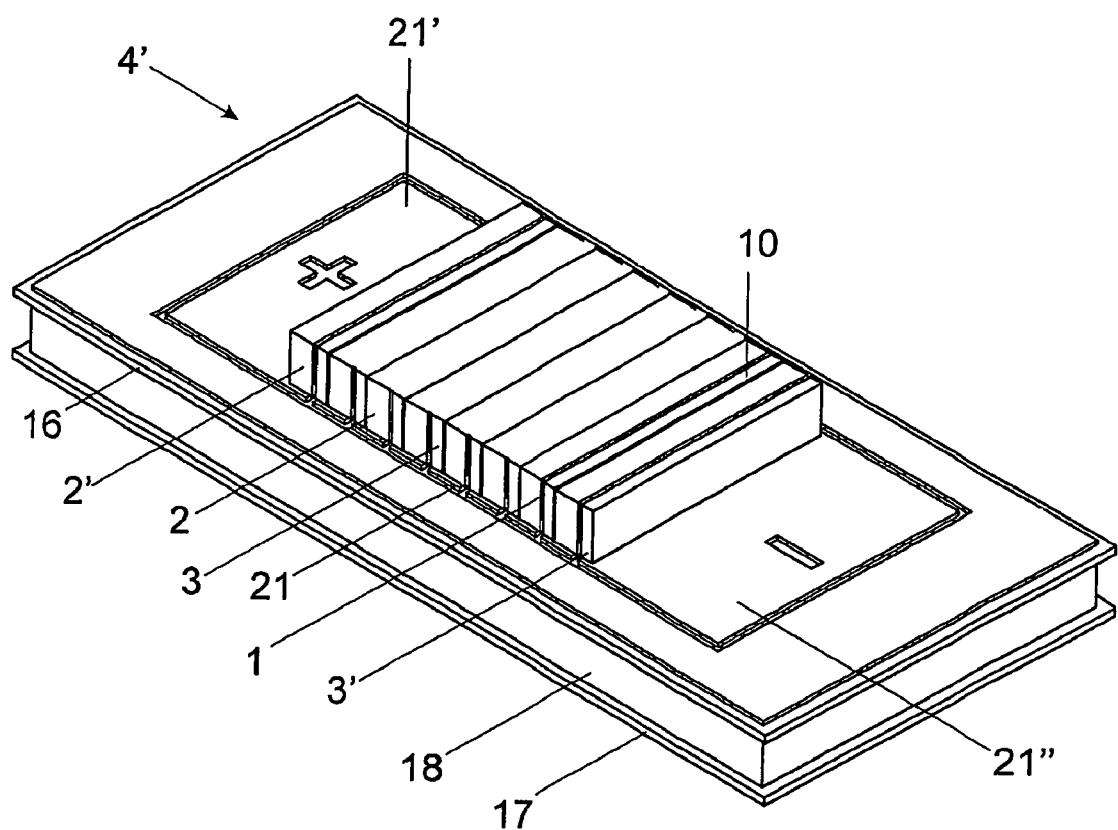
FIG. 8 shows the carrier according to FIG. 7 with laser diode stack arranged thereon.

In another construction of the invention, according to FIGS. 7 and 8, a carrier 4' outfitted with a micro-cooler 18 arranged between two nonmetallic layers 16, 17 of aluminum nitride ceramic layers can be used in place of the plate-shaped carrier 4. The micro-cooler 18 is formed by a plurality of structured metal layers whose structure forms channels which branch in three dimensions for a coolant. A supply channel 19 and a discharge channel 20 for this coolant are provided in the base of the carrier 4'.

Analogous to carrier 4, the carrier 4' is also coated on the top and bottom with metallic layers of copper. The copper layer on the top has a structure corresponding to carrier 4 so that the electric and thermal connection to the p-side and n-side substrate layers 2, 3 can be produced over the layer regions 21, 21' and 21". Electric contact elements, not shown, are guided to the layer regions 21', 21".

Figure 9:
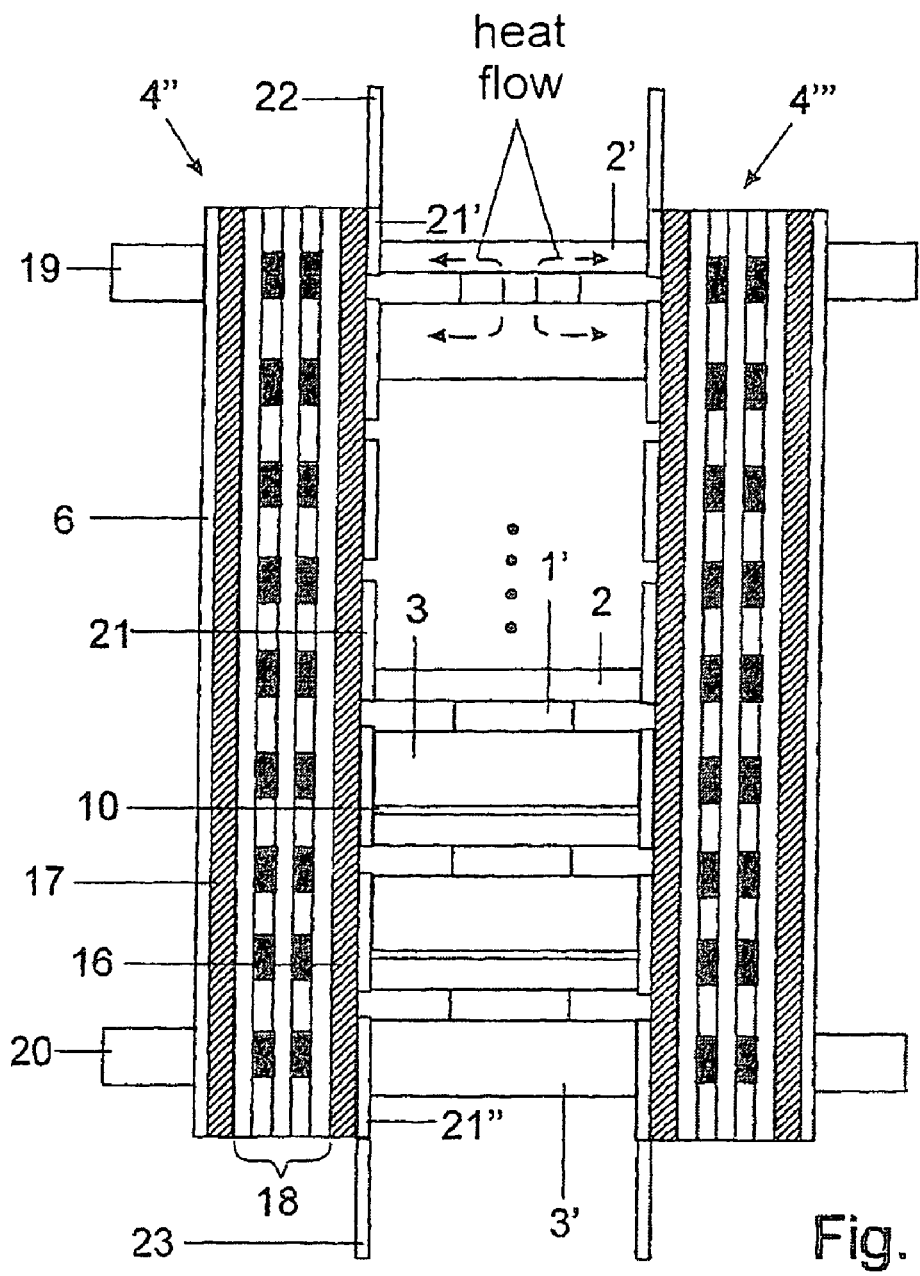
FIG. 9 shows a section through another construction of a laser radiation source according to the invention.
Figure 10:
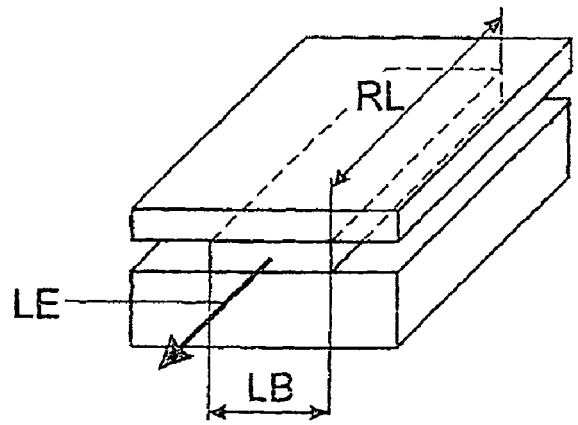
FIG. 10 shows dimensioning ratios in laser diode elements according to FIG. 9.

The laser radiation source shown in FIG. 9 has laser diode elements in the form of semiconductor laser diodes or laser diode bars 1' which—in contrast to the laser diode bars 1 shown in FIGS. 1 to 6 and 8—have (FIG. 10) a different ratio of resonator length RL to light emitting surface width LB (dimension in the slow-axis direction extending parallel to the plane of the p-n junction). If the resonator length is already greater than half of the light emitting surface width, it is advantageous to provide cooling whereby the heat is carried off over the substrate layers 2, 2', 3, 3' perpendicular to the light emitting direction LE of the laser diode elements and perpendicular to the stack direction of the laser diode elements (directions indicated by dashed arrows), rather that in the direction opposite to the light emitting direction LE of the laser diode elements. The laser diode stack formed of laser diode elements is arranged between two identically constructed multi-layer carriers 4", 4''' which can be outfitted, for example, with a micro-cooler 18 corresponding to FIG. 7, oppositely polarized substrate layers 2, 3 of adjacent laser diode elements being arranged on common layer regions (21) of the respective multi-layer carrier 4", 4'''. The rest of the reference numbers correspond to those used in the embodiment examples described above. Electric contact elements for supplying current which are guided at the outside layer regions 21', 21" are designated by 22, 23.

The fastening of the substrate layers 2, 2', 3, 3' to the layer regions 21, 21', 21" is carried out in such a way that the light emitting direction LE of the laser diode elements is directed parallel to the layer regions 21, 21', 21".

Laser diode elements used according to the construction shown in FIG. 9 comprise, e.g., four laser diodes arranged adjacent to one another. This has the advantage that, unlike wider laser diode bars which can usually comprise 20 to 25 laser diodes, there is no need to split beams into partial beam bundles.

Of course, it is also possible in another construction to do away with two-sided cooling by providing only one multi-layer carrier (4", 4''').

While this invention has been described in conjunction with the specific embodiments outlined above, it is evident that many alternatives, modifications, and variations will be apparent to those skilled in the art. Accordingly, the preferred embodiments of the invention as set forth above are intended to be illustrative, not limiting. Various changes may be made without departing from the spirit and scope of the inventions as defined in the following claims.

The invention claimed is:

1. A laser radiation source comprising:
    a vertical stack of laser diode elements which are contacted on both sides via substrate layers of electrically conducting material; and
    at least a first multi-layer carrier including a first and at least a second metallic layer which are separated by at least one electrically insulating layer of nonmetallic material;
    wherein at least one of the metallic layers is divided into metallic layer regions which are arranged adjacent to one another and at a distance from one another;
    wherein oppositely polarized substrate layers of adjacent laser diode elements are arranged on common layer regions of a metallic layer; and
    wherein the sum of the thicknesses of the first and second metallic layers to the sum of the thicknesses of the at least one electrically insulating layer has a ratio of from 1.5:1 to 2.0:1.

2. The laser radiation source according to claim 1;
    wherein a gap is left between the oppositely polarized substrate layers of adjacent laser diode elements.

3. The laser radiation source according to claim 2;
    wherein the first and the second metallic layer are divided into metallic layer regions which are arranged adjacent to one another and at a distance from one another.

4. The laser radiation source according to claim 3;
    wherein the layer regions of the first metallic layer and the layer regions of the second metallic layer are arranged so as to be congruent with one another.

5. The laser radiation source according to claim 3;
    wherein the layer regions of the first metallic layer and the layer regions of the second metallic layer are arranged so as to be offset relative to one another.

6. The laser radiation source according to claim 4;
    wherein the substrate layers which bound the vertical stack of laser diode elements are soldered individually, respectively, to a layer region; and
    wherein an electric contact element is guided at each layer region for supplying current.

7. The laser radiation source according to claim 6;
    wherein the layer regions on which the substrate layers bounding the vertical stack of laser diode elements are soldered make electrical contact with a respective layer region on the side of the carrier opposite to that on which the electric contact elements are arranged at the layer regions.

8. The laser radiation source according to claim 1;
    wherein the dimension of the p-side substrate layers in direction perpendicular to the contact surfaces of the laser diode element are 0.5 to 1 times the resonator length of the laser diode element, and the dimension of the n-side substrate layers is 0.25 to 0.5 times the resonator length of the laser diode element.

9. The laser radiation source according to claim 1;
    wherein the dimension of the substrate layers in the light emitting direction along the layer regions exceeds the resonator length of the laser diode elements, but is less than twice the resonator length.

10. The laser radiation source according to claim 1;
    wherein the laser diode elements are constructed as laser diode bars.

11. The laser radiation source according to claim 1;
    wherein the laser diode elements have a resonator length which is greater than half of the dimension of the light emitting surface in the slow-axis direction.

12. The laser radiation source according to claim 11;
    wherein the substrate layers are fastened to the layer regions in such a way that the light emitting direction of the laser diode elements is directed parallel to the layer regions.

13. The laser radiation source according to claim 12;
    wherein a second multi-layer carrier comprising a first metallic layer and a second metallic layer which are separated by at least one electrically insulating layer of nonmetallic material;
    wherein at least one of the metallic layers is divided into metallic layer regions which are arranged adjacent to one another and at a distance from one another, and the stack of laser diode elements is arranged between the first multi-layer carrier and the second multi-layer carrier; and
    wherein oppositely polarized substrate layers of adjacent laser diode elements are arranged on common layer regions of the respective carrier.

14. The laser radiation source according to claim 1;
    wherein at least one carrier has a thermal expansion coefficient in the surface region of the layer regions that is similar to that of the substrate .

15. The laser radiation source according to claim 14;
    wherein the substrate layers are connected to the layer regions by a gold-tin solder containing more than 50 atom percent of gold.

16. The laser radiation source according to claim 1;
wherein the substrate layers are connected to the layer regions by a soft solder with high tin content.

17. The laser radiation source according to claim 1;
wherein the first and second metallic layer comprise copper.

18. The laser radiation source according to claim 17;
wherein the at least one electrically insulating layer is made of aluminum nitride ceramic.

19. The laser radiation source according to claim 18;
wherein the sum of the thicknesses of the metallic layers of copper is twice the sum of the thicknesses of the nonmetallic layers made of aluminum nitride ceramic.

20. The laser radiation source according to claim 18;
wherein the sum of the thicknesses of the metallic layers of copper to the sum of the thicknesses of the nonmetallic layers of aluminum nitride ceramic has ratios from 1.5:1 to 2.0:1 with a Vickers hardness of the copper in the range of HV60 to HV120.

21. The laser radiation source according to claim 1;
wherein the multi-layer carrier is outfitted with a microcooler which is arranged between nonmetallic layers and which has channels for a coolant, and a supply channel and a discharge channel are provided for this coolant in the bottom of the multi-layer carrier.

22. A laser radiation source comprising:
a vertical stack of laser diode elements which are contacted on both sides via substrate layers of electrically conducting material; and
at least a first multi-layer carrier including a first and at least a second metallic layer which are separated by at least one electrically insulating layer of nonmetallic material;
wherein the first and second metallic layers are divided into metallic layer regions which are arranged adjacent to one another and at a distance from one another, so that the metallic layer regions of a single metallic layer are electrically isolated from each other,
wherein oppositely polarized substrate layers of adjacent laser diode elements are arranged on common layer regions of the first metallic layer;
wherein first and second end substrate layers which bind the vertical stack of laser diode elements are soldered individually, respectively, to first and second end layer regions of the first metallic layer, and
wherein the first and second end layer regions of the first metallic layer each make electrical contact with a corresponding respective layer region of the second metallic layer.

* * * * *